United States Patent
Pan et al.

(10) Patent No.: US 10,101,367 B2
(45) Date of Patent: Oct. 16, 2018

(54) MICROELECTRONIC TEST DEVICE INCLUDING A PROBE CARD HAVING AN INTERPOSER

(71) Applicant: INTEL CORPORATION, Santa Clara, CA (US)

(72) Inventors: Jin Pan, Portland, OR (US); Jin Yang, Hillsboro, OR (US); Erkan Acar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 14/683,742

(22) Filed: Apr. 10, 2015

(65) Prior Publication Data

US 2016/0299174 A1   Oct. 13, 2016

(51) Int. Cl.
   *G01R 3/00*   (2006.01)
   *G01R 1/073*   (2006.01)
   *G01R 31/28*   (2006.01)

(52) U.S. Cl.
   CPC .......... *G01R 3/00* (2013.01); *G01R 1/07378* (2013.01); *G01R 1/07307* (2013.01); *G01R 1/07314* (2013.01); *G01R 1/07342* (2013.01); *G01R 31/2889* (2013.01)

(58) Field of Classification Search
   CPC ............ G01R 1/07378; G01R 31/2889; G01R 1/07307; G01R 1/07314; G01R 1/07342
   USPC .................................................... 324/756.03
   See application file for complete search history.

(56) References Cited

U.S. PATENT DOCUMENTS

| 7,845,072 B2* | 12/2010 | Hobbs | G01R 31/2886 29/831 |
| 8,933,719 B2* | 1/2015 | Huang | G01R 1/07342 324/756.03 |
| 2004/0165888 A1 | 8/2004 | Gerstel et al. | |
| 2006/0125498 A1* | 6/2006 | Liu | G01R 31/2889 324/756.03 |
| 2007/0083786 A1 | 4/2007 | Chiang | |
| 2007/0090847 A1* | 4/2007 | Lu | G01R 31/2889 324/754.07 |

(Continued)

OTHER PUBLICATIONS

B. Banijamali, S. Ramalingam, K. Nagarajan and R. Chaware, "Advanced reliability study of TSV interposers and interconnects for the 28nm technology FPGA," 2011 IEEE 61st Electronic Components and Technology Conference (ECTC), Lake Buena Vista, FL, 2011, pp. 285-290. doi: 10.1109/ECTC.2011.5898527.*

(Continued)

*Primary Examiner* — Christopher McAndrew
(74) *Attorney, Agent, or Firm* — Green, Howard, & Mughal LLP

(57) ABSTRACT

A microelectronic test device comprising an organic substrate, a probe holder, and an interposer disposed between the organic substrate and the probe holder, wherein the interposer has a coefficient of thermal expansion that is less than a coefficient of thermal expansion of the organic substrate. The interposer may effectively decouple the organic substrate from probes in the probe holder, which may substantially reduce or eliminate probe misalignment due to the coefficient of thermal expansion mismatch between the organic substrate and other components of the microelectronic test device and to provide require stiffness to the organic substrate.

24 Claims, 3 Drawing Sheets

(56) References Cited

U.S. PATENT DOCUMENTS

| | | | | |
|---|---|---|---|---|
| 2007/0108997 A1* | 5/2007 | Motoyama | G01R 1/07314 | 324/754.03 |
| 2007/0202630 A1* | 8/2007 | Kurata | H01L 21/561 | 438/106 |
| 2007/0247175 A1* | 10/2007 | Khandros | G01R 1/06727 | 324/754.07 |
| 2007/0296422 A1* | 12/2007 | Miller | G01R 31/2889 | 324/754.07 |
| 2009/0158586 A1* | 6/2009 | Hobbs | G01R 31/2886 | 29/884 |
| 2009/0261849 A1* | 10/2009 | McGlory | G01R 1/07342 | 324/756.03 |
| 2010/0117673 A1* | 5/2010 | Lee | G01R 1/07378 | 324/756.03 |
| 2010/0284486 A1 | 11/2010 | Kuwata | | |
| 2011/0229127 A1 | 9/2011 | Sakamoto et al. | | |
| 2013/0135001 A1* | 5/2013 | Breinlinger | G01R 1/067 | 324/754.03 |
| 2013/0271929 A1* | 10/2013 | Malatkar | H05K 1/0271 | 361/748 |
| 2013/0322872 A1 | 12/2013 | Jobert et al. | | |
| 2014/0054790 A1* | 2/2014 | Kuo | H01L 23/3121 | 257/774 |
| 2014/0270751 A1 | 9/2014 | Figueria | | |
| 2014/0340109 A1* | 11/2014 | Hung | G01R 31/2887 | 324/756.03 |
| 2015/0070038 A1* | 3/2015 | Joo | G01R 1/07371 | 324/754.07 |

OTHER PUBLICATIONS

PCT International Search Report And Written Opinion for PCT International Appln No. PCT/US2016/026225 dated Aug. 24, 2016. (13 pages).

\* cited by examiner

MICROELECTRONIC TEST DEVICE INCLUDING A PROBE CARD HAVING AN INTERPOSER

TECHNICAL FIELD

Embodiments of the present description generally relate to the field of microelectronic wafer sorting and/or microelectronic die testing, and, more particularly, to the use of an interposer to compensate for issues caused by thermal expansion.

BACKGROUND

In the fabrication of microelectronic devices for use in various electronic products, including, but not limited to portable products, such as portable computers, digital cameras, electronic tablets, cellular phones, and the like, a plurality of microelectronic dice are formed on a microelectronic wafer through a variety of processing step, which are well known in the art. As the various processing steps may have variances and other manufacturing issues, some of the individual microelectronic dice may have defects, which may render them inoperable. Therefore, either prior to or after wafer dicing, wherein each of the microelectronic dice are cut from the microelectronic wafer, electrical performance and reliability tests may be performed on the microelectronic dice to determine if any of the microelectronic dice have defects, such that the defective microelectronic dice can be scrapped or reworked prior to further fabrication processes.

As will be understood to those skilled in the art, probe cards, which are used to perform the electrical performance and reliability tests, may include components, such as space transformer, which may be fabricated from organic materials. Such organic based space transformers may have low stiffness and a large coefficient of thermal expansion relative to other components of the probe card. As will also be understood to those skilled in the art, test probes extend from the space transform to contact bond pads on the microelectronic die under test (DUT). However, the coefficient of thermal expansion mismatch between the organic based space transformer and the other components of the probe card may result in misalignment (in the X, Y, and/or Z directions) of the test probes with the bond pads on the microelectronic die under test. Thus, there is a need for solutions in the fabrication of probe cards to substantially reduce or eliminate such misalignment.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
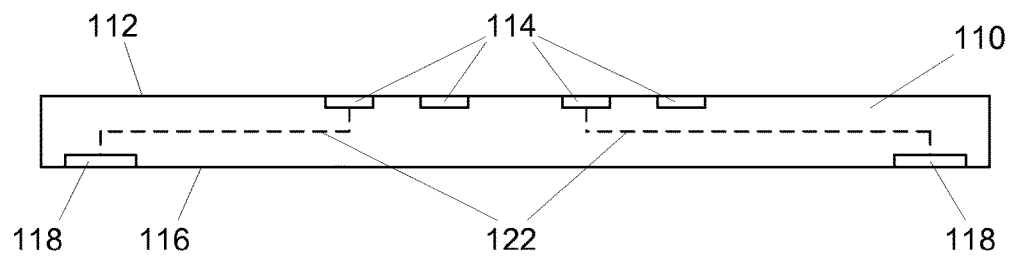
FIGS. 1-5 illustrate side cross sectional views of a method of forming a microelectronic test device, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

The microelectronic industry is continuously decreasing the size of microelectronic dice. This continuous scaling down of microelectronic dice decreases the pitch of first level interconnects therein, which, in turn, increases the complexity of electrical routing required for the space transformers in a test head. This increasing complexity of electrical routing makes fabricating space transformers from ceramic material (such as a multi-layer ceramic space transformer) prohibitively expensive. Thus, organic substrate/package based space transformer technology is becoming more attractive. However, the organic substrates normally have a much lower stiffness and higher coefficient of thermal expansion compared to the multi-layer ceramic based space transformers. As will be understood to those skilled in the art, ceramic based space transformer normally has a high stiffness and low coefficient of thermal expansion to match that of other components of the test head. For example, the Young's modulus of multi-layer ceramic based space transformer could reach up to 330 Gpa and its coefficient of thermal expansion could be down to about 3.2 ppm/° C. Table 1 is a comparison of key material properties between multi-layer ceramic material, ceramic material and known organic substrates is shown. It is noted that the thickness of the compared organic substrates is smaller than the multi-layer ceramic material and ceramic material substrate due to substrate lamination limitation, as will be understood to those skilled in the art.

TABLE 1

| Material | CTE (ppm/° C.) | Young's modulus (Gpa) | Thickness (mm) |
|---|---|---|---|
| Organic Substrate | ~17.0-20.0 | 30 in-plane 3.5 out-of plane | 0.50-1.056 |
| Multi-Layer Ceramic | ~6.7 | 330 | 3.81 |
| Ceramic (99.5% aluminum oxide) | ~7.8 | 300 | 3.81 |

Due to thickness and material stiffness reduction of the space transformer based on the organic substrate, probe tip alignment and co-planarity in the manufacturing process, probe tip position and probe actual over travel (AOT), and permanent deformation and reliability of the organic substrate in a microelectronic die testing process may be problematical.

Embodiments of the present description include a microelectronic test device comprising an organic substrate, a probe holder, and an interposer disposed between the organic substrate and the probe holder, wherein the interposer has a coefficient of thermal expansion to substantially match that of other components in microelectronic test device (excluding the organic substrate) and that is less than a coefficient of thermal expansion of the organic substrate. The interposer may effectively decouple the organic substrate from probes in the probe holder, which may substantially reduce or eliminate probe misalignment due to the coefficient of thermal expansion mismatch between the organic substrate and other components of the microelectronic test device and to provide required stiffness to the organic substrate.

FIGS. 1-5 illustrate a method of fabricating a microelectronic test device according to one embodiment of the present description. As shown in FIG. 1, an organic substrate 110, such as a space transformer, may be fabricated, wherein the organic substrate 110 may have a first surface 112, referred to as a C4 side, having at least one interposer contact 114 formed therein or thereon, and an opposing second surface 116, referred to as an LGA side, having at least one external contact 118 formed therein or thereon. The organic substrate 110 may further include at least one conductive route (generically shown as dash line 122), wherein each organic substrate conductive route 122 may extend between the at least one organic substrate external contact 118 and its corresponding organic substrate interposer contact 114.

The term "organic", for the purposes of the present description, is defined to refer to carbon-based substrate material. Thus, organic substrate 110 may be primarily composed of any appropriate organic dielectric material, including, but not limited to, liquid crystal polymer, fiber reinforced core, epoxy resin, bismaleimine triazine resin, polyimide materials, and the like, as well as laminates or multiple layers thereof. The organic substrate conductive routes 122, the organic substrate external contacts 118, and the organic substrate interposer contacts 114 may be composed of any appropriate conductive material, including but not limited to metals, such as copper, silver, nickel, gold, and aluminum, alloys thereof, and the like. As will be understood to those skilled in the art, although not specifically illustrated, the organic substrate conductive routes 122 may be formed as a plurality of conductive traces formed on layers of organic dielectric material, which may be connected by conductive vias through the organic dielectric material layers.

The term "space transformer", for the purposes of the present description, is defined to refer to a microelectronic substrate that translates the relatively tight pitch of the organic substrate interposer contacts 114 to a relatively loose pitch of the organic substrate external contacts 118.

Figure 2:
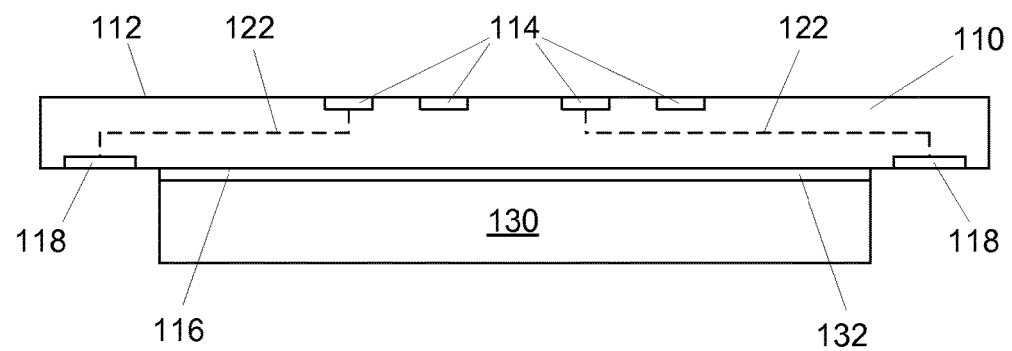

As shown in FIG. 2, the organic substrate second surface 116 may be attached to a compensator 130 with a first adhesive material layer 132, such as an epoxy adhesive, adhesive films, and the like. As further illustrated, the compensator 130 may be positioned perpendicularly opposing the organic substrate interposer contacts 114. In one embodiment of the present description, the compensator 130 may have a coefficient of thermal expansion that is lower than a coefficient of thermal expansion of the organic substrate 110. In an embodiment of the present description, the compensator 130 may comprise a glass or ceramic material. In a specific embodiment, the compensator 130 may be formed form a material selected from the group consisting of non-conductive metal, aluminum oxide, and silicon nitride ceramic.

Figure 3:
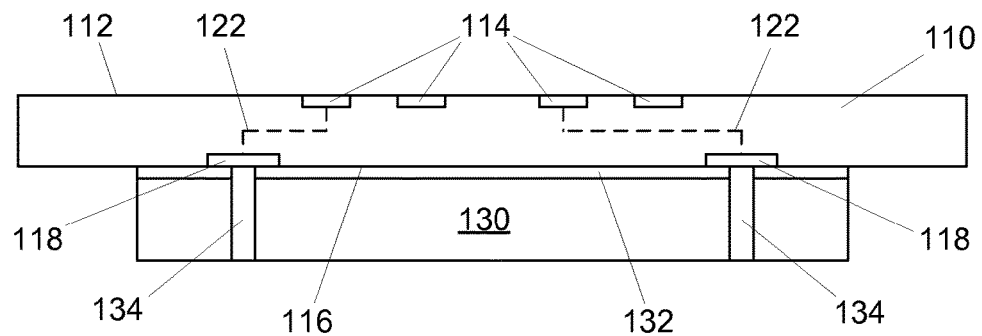

As further shown in FIG. 2, the organic substrate external contacts 118 are positioned such that they are not obstructed by the compensator 130. However, as shown in FIG. 3, in an alternate embodiment, the compensator 130 may have conductive vias 134 extending therethrough to contact the organic substrate external contacts 118 to form conductive routes thereto. As will be understood to those skilled in the art, external test signals are directed to the organic substrate external contacts 118.

Figure 4:
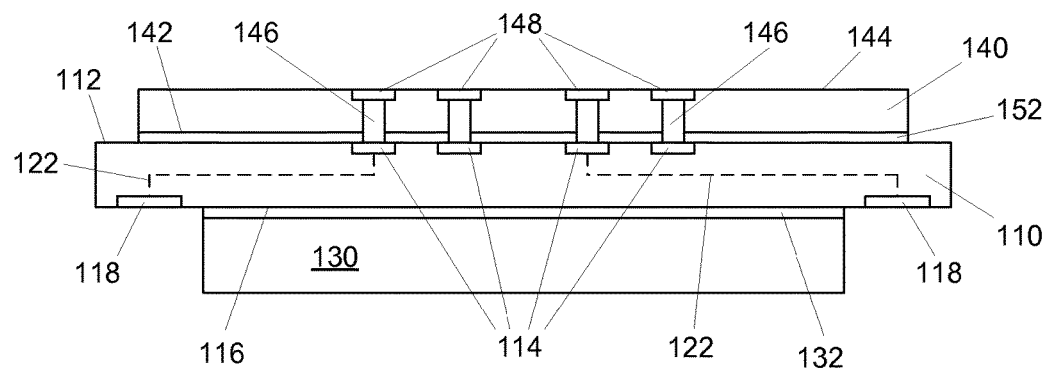

As shown in FIG. 4, an interposer 140 may be attached to the organic substrate first surface 112 with a second adhesive material layer 152, such as an epoxy adhesive, or through a thermal bonding process. The interposer 140 may have a first surface 144 having at least one probe contact 148 formed therein or thereon, an opposing second surface 142, and at least one conductive via 146 extending from the at least one interposer probe contact 148 and a corresponding organic substrate interposer contact 114. In one embodiment of the present description, the interposer 140 may have a coefficient of thermal expansion that is lower than a coefficient of thermal expansion of the organic substrate 110. In an embodiment of the present description, the interposer 140 may comprise a glass or a ceramic material. In a specific embodiment, the interposer 140 may be made from either aluminum oxide or silicon nitride ceramic. The interposer probe contacts 148 and the interposer conductive vias 146 may be formed from any appropriate conductive material, such as metal, including but not limited to metals, such as copper, silver, nickel, gold, and tungsten, alloys thereof, and the like. As will be understood to those skilled in the art, a redistribution layer (RDL) may be formed inside the interposer for appropriate electrical routing purposes.

Figure 5:
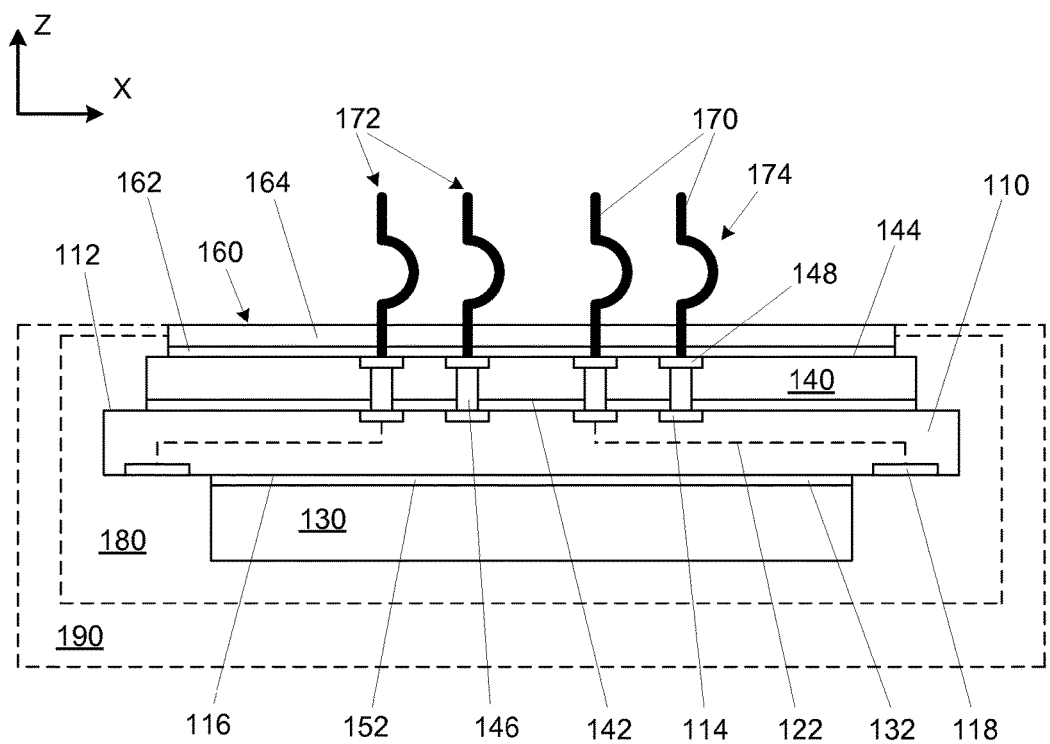

As shown in FIG. 5, a probe holder 160 may be attached to the interposer 140. In an illustrated embodiment, the probe holder 160 may be attached to the interposer 140 with a third adhesive material layer 162, such as an epoxy adhesive. The probe holder 160 may have a base 164 and at least one probe 170 extending through the probe holder base 164 to contact a corresponding interposer probe contact 148.

The probe 170 may include a probe tip 172 which would come into contact with a contact structure of a microelectronic die under test (not shown) during a testing process, and may include a resilient portion 174, such an arc, a spring, or the like, which may give the probe 170 sufficient flexibility so that it can overcome any planarity variation of between the contact structures of the microelectronic die under test (not shown) to make good contact therewith and so it does not damage the contact structure of a microelectronic die under test (not shown) during a testing process. As further shown in FIG. 5, the described components may be a part of a probe card 180, generically demarked with an inner dash line, wherein the probe card 180 may include additional components. The probe card 180 may be a part of an overall microelectronic test device 190, generically demarked with an outer dash line, wherein the microelectronic test device 190 may include additional components and structure. The various additional components and structures of the probe card 180 and the microelectronic test device 190 are well known in the art, and, for the sake of brevity and conciseness, will not be describe herein.

The interposer 140 may effectively decouple the organic substrate 110 from the probes 170, which may substantially reduce or eliminate probe 170 misalignment due to the coefficient of thermal expansion mismatch between the organic substrate 110 and other components of the microelectronic test device 190 and to provide required stiffness to the organic substrate 110, as previously discussed. As will be understood to those skilled in the art, the use of the interposer 140 can reduce the effective in-plane (e.g. the X/Y plane, where the Y direction (not label) extends perpendicularly from FIG. 5) coefficient of thermal expansion experienced by the probes 170 from about 17.0-20.0 ppm/'C (approximate coefficient of thermal expansion of the organic substrate 110) down to about 3-5 ppm/'C (approximate coefficient of thermal expansion of the interposer 140 made of a ceramic material).

It is understood that the compensator 130 may be an optional component of the microelectronic test device 190. However, the compensator 130 being made of a material having coefficient of thermal expansion lower than a coefficient of thermal expansion of organic substrate 110 and a higher stiffness than the organic substrate 110 may be further assist in compensating for the mismatch between the organic substrate 110 and the other components of the microelectronic test device 190.

Figure 6:
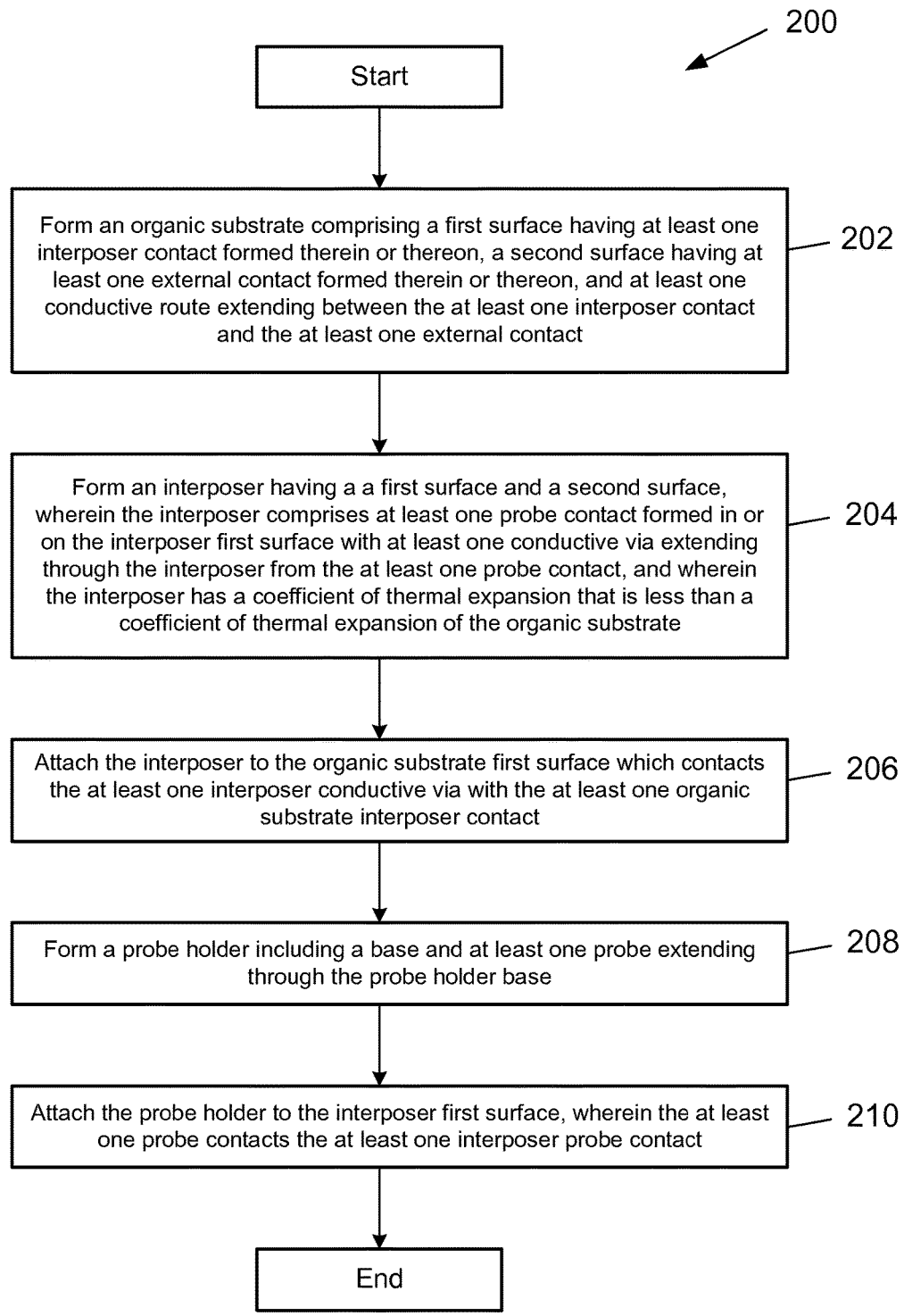
FIG. 6 is a flow diagram of a process of fabricating a microelectronic test device, according to an embodiment of the present description.

FIG. 6 is a flow chart of a process 200 of fabricating a microelectronic test device according to an embodiment of the present description. As set forth in block 202, an organic substrate may be formed comprising a first surface having at least one interposer contact formed therein or thereon, a second surface having at least one external contact formed therein or thereon, and at least one conductive trace extending between the at least one interposer contact and the at least one external contact. An interposer may be formed having a first surface and a second surface, wherein the interposer comprises at least one probe contact formed in or on the interposer first surface with at least one conductive via extending through the interposer from the at least one probe contact, and wherein the interposer has a coefficient of thermal expansion that is less than a coefficient of thermal expansion of the organic substrate, as set forth in block 204. As set forth in block 206, the interposer may be attached to the organic substrate first surface which contacts the at least one interposer conductive via with the at least one organic substrate interposer contact. A probe holder may be formed including a base and at least one probe extending through the probe holder base, as set forth in block 208. As set forth in block 210, the probe holder may be attached to the interposer first surface, wherein the at least one probe contacts the at least one interposer probe contact.

It is understood that the subject matter of the present description is not necessarily limited to specific applications illustrated in FIGS. 1-6. The subject matter may be applied to other microelectronic device testing and microelectronic package assembly applications, as will be understood to those skilled in the art.

The following examples pertain to further embodiments, wherein Example 1 is a microelectronic test device comprising an organic substrate having a first surface and an opposing second surface; a probe holder; and an interposer disposed between the organic substrate first surface and the probe holder, wherein the interposer has a coefficient of thermal expansion that is less than a coefficient of thermal expansion of the organic substrate.

In Example 2, the subject matter of Example 1 can optionally include the interposer comprising a ceramic material.

In Example 3, the subject matter of Example 1 can optionally include the interposer comprising a glass material.

In Example 4, the subject matter of Example 2 can optionally include the interposer comprising a material selected from the group consisting of aluminum oxide and silicon nitride ceramic.

In Example 5, the subject matter of any of Examples 1 to 4 can optionally include the interposer further comprising at least one probe contact formed in or on a first surface of the interposer, a second surface, and at least one conductive via extending through the interposer from the at least one probe contact.

In Example 6, the subject matter of any of Examples 1 to 5 can optionally include the organic substrate comprises a first surface having at least one interposer contact formed therein or thereon, a second surface having at least one external contact formed therein or thereon, and at least one conductive route extending between the at least one interposer contact and the at least one external contact.

In Example 7, the subject matter of any of Examples 1 to 6 can optionally include the probe holder including a base and at least one probe extending through the probe holder base.

In Example 8, the subject matter of Example 7 can optionally include the at least one probe contacting the at least one interposer probe contact.

In Example 9, the subject matter of any of Examples 1 to 8 can optionally include a compensator disposed proximate the organic substrate second surface, wherein the compensator has a coefficient of thermal expansion that is less than a coefficient of thermal expansion of the organic substrate.

The following examples pertain to further embodiments, wherein Example 10 is a microelectronic test device comprising an organic substrate comprises a first surface having at least one interposer contact formed therein or thereon, a second surface having at least one external contact formed therein or thereon, and at least one conductive route extending between the at least one interposer contact and the at least one external contact; an interposer having a first surface and a second surface, wherein the interposer second surface is attached to the organic substrate first surface, wherein the interposer comprises at least one probe contact formed in or on the interposer first surface with at least one conductive via extending through the interposer from the at least one probe contact and contacting at least one organic substrate interposer contact, and wherein the interposer has a coefficient of thermal expansion that is less than a coefficient of thermal expansion of the organic substrate; and a probe holder including a base and at least one probe extending through the probe holder base attached to the interposer first surface, wherein at least one probe contacts at least one interposer probe contacts.

In Example 11, the subject matter of Example 10 can optionally include the interposer comprising a ceramic material.

In Example 12, the subject matter of Example 10 can optionally include the interposer comprising a glass material.

In Example 13, the subject matter of Example 10 can optionally include the interposer comprising a ceramic material selected from the group consisting of aluminum oxide and silicon nitride ceramic.

In Example 14, the subject matter of any of Examples 10 to 13 can optionally include a compensator disposed proximate the organic substrate second surface, wherein the compensator has a coefficient of thermal expansion that is less than a coefficient of thermal expansion of the organic substrate.

In Example 15, the subject matter of Example 14 can optionally include the compensator comprising a ceramic material.

In Example 16, the subject matter of Example 14 can optionally include the compensator comprising a glass material.

In Example 17, the subject matter of Example 14 can optionally include the compensator comprising a material selected from the group consisting of non-conductive metal, aluminum oxide, and silicon nitride ceramic.

The following examples pertain to further embodiments, wherein Example 18 is a method of fabricating a microelectronic test device comprising forming an organic substrate comprising a first surface having at least one interposer contact formed therein or thereon, a second surface having at least one external contact formed therein or thereon, and at least one conductive route extending between the at least one interposer contact and the at least one external contact; forming an interposer having a first surface and a second surface, wherein the interposer comprises at least one probe contact formed in or on the interposer first surface with at least one conductive via extending through the interposer from the at least one probe contact, and wherein the interposer has a coefficient of thermal expansion that is less than a coefficient of thermal expansion of the organic substrate; attaching the interposer second surface to the organic substrate first surface which contacts the at least one interposer conductive via with the at least one organic substrate interposer contact; forming a probe holder including a base and at least one probe extending through the probe holder base; and attaching the probe holder to the interposer first surface, wherein at least one probe contacts the at least one interposer probe contact.

In Example 19, the subject matter of Example 18 can optionally include forming the interposer comprising forming the interposer from a ceramic material.

In Example 20, the subject matter of Example 18 can optionally include forming the interposer comprising forming the interposer from a glass material.

In Example 21, the subject matter of Example 18 can optionally include forming the interposer from a ceramic material comprising forming the interposer from a ceramic material selected from the group consisting of aluminum oxide and silicon nitride ceramic.

In Example 22, the subject matter of any of Examples 18 to 21 can optionally include attaching a compensator to the organic substrate second surface, wherein the compensator has a coefficient of thermal expansion that is less than a coefficient of thermal expansion of the organic substrate.

In Example 23, the subject matter of Example 22 can optionally include attaching the compensator comprising attaching a ceramic material compensator.

In Example 24, the subject matter of Example 22 can optionally include attaching the compensator comprising attaching a glass material compensator.

In Example 25, the subject matter of Example 22 can optionally include attaching the compensator comprising attaching a compensator formed from a material selected from the group consisting of non-conductive metal, aluminum oxide, and silicon nitride ceramic.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic test device comprising:
   an organic substrate having a first surface and an opposing second surface;
   a probe holder, wherein the probe holder includes a base and at least one probe, wherein a portion of the at least one probe extends through the probe holder base and another portion of the at least one probe extends from the probe holder base and includes a resilient portion;
   an interposer disposed between the organic substrate first surface and the probe holder, wherein the interposer has a coefficient of thermal expansion that is less than a coefficient of thermal expansion of the organic substrate, wherein the at least one probe does not extend through the interposer; and
   an adhesive material layer in contact with the probe holder and the interposer, wherein the portion of the at least one probe extending through the probe holder further extends through the adhesive material layer and contacts the interposer.

2. The microelectronic test device of claim 1, wherein the interposer comprises a ceramic material.

3. The microelectronic test device of claim 1, wherein the interposer comprises a glass material.

4. The microelectronic test device of claim 1, wherein the interposer comprises a material selected from the group consisting of aluminum oxide and silicon nitride ceramic.

5. The microelectronic test device of claim 1, wherein the interposer further comprises at least one probe contact formed in or on a first surface of the interposer, a second surface, and at least one conductive via extending through the interposer from the at least one probe contact.

6. The microelectronic test device of claim 1, wherein the organic substrate comprises a first surface having at least one interposer contact formed therein or thereon, a second surface having at least one external contact formed therein or thereon, and at least one conductive route extending between the at least one interposer contact and the at least one external contact.

7. The microelectronic test device of claim 5, where the at least one probe contacts the at least one interposer probe contact.

8. The microelectronic test device of claim 1, further comprising a compensator attached to the organic substrate second surface, wherein the compensator has a coefficient of thermal expansion that is less than a coefficient of thermal expansion of the organic substrate.

9. A microelectronic test device comprising:

an organic substrate comprises a first surface having at least one interposer contact formed therein or thereon, a second surface having at least one external contact formed therein or thereon, and at least one conductive route extending between the at least one interposer contact and the at least one external contact;

an interposer having a first surface and a second surface, wherein the interposer second surface is attached to the organic substrate first surface, wherein the interposer comprises at least one probe contact formed in or on the interposer first surface with at least one conductive via extending through the interposer from the at least one probe contact and contacting at least one organic substrate interposer contact, and wherein the interposer has a coefficient of thermal expansion that is less than a coefficient of thermal expansion of the organic substrate;

a probe holder including a base and at least one probe, wherein a portion of the at least one probe extends through the probe holder base and another portion of the at least one probe extends from the probe holder base and includes a resilient portion, and wherein the probe holder base is attached to the interposer first surface, wherein the at least one probe contacts at least one interposer probe contacts and wherein the at least one probe does not extend through the interposer; and an adhesive material layer in contact with the probe holder and the interposer, wherein the portion of the at least one probe extending through the probe holder further extends through the adhesive material layer and contacts the interposer.

10. The microelectronic test device of claim 9, wherein the interposer comprises a ceramic material.

11. The microelectronic test device of claim 9, wherein the interposer comprises a glass material.

12. The microelectronic test device of claim 9, wherein the interposer comprises a material selected from the group consisting of aluminum oxide and silicon nitride ceramic.

13. The microelectronic test device of claim 9, further comprising a compensator attached to the organic substrate second surface, wherein the compensator has a coefficient of thermal expansion that is less than a coefficient of thermal expansion of the organic substrate.

14. The microelectronic test device of claim 13, wherein the compensator comprises a ceramic material.

15. The microelectronic test device of claim 13, wherein the compensator comprises a glass material.

16. The microelectronic test device of claim 13, wherein the compensator comprises a material selected from the group consisting of non-conductive metal, aluminum oxide, and silicon nitride ceramic.

17. A method of fabricating a microelectronic test device comprising:

forming an organic substrate comprising a first surface having at least one interposer contact formed therein or thereon, a second surface having at least one external contact formed therein or thereon, and at least one conductive route extending between the at least one interposer contact and the at least one external contact;

forming an interposer having a first surface and a second surface, wherein the interposer comprises at least one probe contact formed in or on the interposer first surface with at least one conductive via extending through the interposer from the at least one probe contact, and wherein the interposer has a coefficient of thermal expansion that is less than a coefficient of thermal expansion of the organic substrate;

attaching the interposer second surface to the organic substrate first surface which contacts the at least one interposer conductive via with the at least one organic substrate interposer contact;

forming a probe holder including a base and at least one probe, wherein a portion of the at least one probe extends through the probe holder base and another portion of the at least one probe extends from the probe holder base and includes a resilient portion; and attaching the probe holder to the interposer first surface with an adhesive material layer that contacts the probe holder and the interposer first surface, wherein the portion of the at least one probe extending through the probe holder further extends though the adhesive material layer and contacts the at least one interposer probe contact and wherein the at least one probe does not extend through the interposer.

18. The method of claim 17, wherein forming the interposer comprises forming the interposer from a ceramic material.

19. The method of claim 17, wherein forming the interposer comprises forming the interposer from a glass material.

20. The method of claim 17, wherein forming the interposer from a ceramic material comprises forming the interposer from a material selected from the group consisting of aluminum oxide and silicon nitride ceramic.

21. The method of claim 17, further comprising attaching a compensator to the organic substrate second surface, wherein the compensator has a coefficient of thermal expansion that is less than a coefficient of thermal expansion of the organic substrate.

22. The method of claim 21, wherein attaching the compensator comprises attaching a ceramic material compensator.

23. The method of claim 21, wherein attaching the compensator comprises attaching a glass material compensator.

24. The method of claim 21, wherein attaching the ceramic material compensator comprises attaching compensator formed from a material selected from the group consisting of non-conductive metal, aluminum oxide, and silicon nitride ceramic.

* * * * *